(12) United States Patent  
Wilson et al.

(10) Patent No.: US 8,717,102 B2
(45) Date of Patent: May 6, 2014

(54) RF DEVICE WITH COMPENSATORY RESONATOR MATCHING TOPOLOGY

(75) Inventors: Richard Wilson, Morgan Hill, CA (US); Saurabh Goel, Campbell, CA (US)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/246,344

(22) Filed: Sep. 27, 2011

(65) Prior Publication Data
US 2013/0076446 A1 Mar. 28, 2013

(51) Int. Cl.
*H03F 3/04* (2006.01)
(52) U.S. Cl.
USPC .......... 330/302; 330/295; 330/124 R
(58) Field of Classification Search
USPC ............... 330/302, 295, 124 R, 286
See application file for complete search history.

(56) References Cited

U.S. PATENT DOCUMENTS

| | | |
|---|---|---|
| 3,426,288 A | 2/1969 | Giorgetti |
| 6,252,461 B1 * | 6/2001 | Raab ............................ 330/302 |
| 6,784,732 B2 * | 8/2004 | Hajimiri et al. ............... 330/251 |
| 7,236,053 B2 | 6/2007 | Pribble et al. |
| 7,265,619 B2 * | 9/2007 | Tayrani ......................... 330/251 |
| 7,573,350 B2 | 8/2009 | Frank |
| 7,746,173 B1 | 6/2010 | Tserng et al. |
| 7,800,448 B2 | 9/2010 | Blednov |
| 2006/0038632 A1 | 2/2006 | Niu et al. |
| 2008/0315392 A1 | 12/2008 | Farrell et al. |
| 2010/0308920 A1 | 12/2010 | Jeong et al. |
| 2011/0031571 A1 | 2/2011 | Bouisse |

FOREIGN PATENT DOCUMENTS

JP 2001237647 A 8/2001

* cited by examiner

*Primary Examiner* — Hieu Nguyen
(74) *Attorney, Agent, or Firm* — Murphy, Bilak & Homiller, PLLC

(57) ABSTRACT

An amplifier circuit includes an RF transistor, a parallel resonator and a series resonator. The RF transistor has an input, an output and an intrinsic output capacitance. The parallel resonator is connected to the output of the RF transistor and includes a first inductive component connected in parallel with the intrinsic output capacitance of the RF transistor. The series resonator connects the output of the RF transistor to an output terminal and includes a second inductive component connected in series with a capacitive component. The series resonator is operable to compensate for a change in impedance of the parallel resonator over frequency.

17 Claims, 7 Drawing Sheets

RF DEVICE WITH COMPENSATORY RESONATOR MATCHING TOPOLOGY

TECHNICAL FIELD

The present application relates to RF devices, in particular RF transistors with an intrinsic output capacitance.

BACKGROUND

Conventional high power, high frequency RF devices typically include an internal shunt inductance matching network for resonating the device intrinsic output capacitance and allowing easier external matching of the device. However such an LC network has frequency limitations because of the inherent resonant nature of the structure. In addition, the high power RF device package uses bond wires for carrying the signal from the die to the package edge. These bond wires introduce undesirable series inductance to the LC matching network, forcing a higher Q match than may be desirable. The Q may be reduced at the package by using an internal lumped shunt inductor followed by an LC low pass matching structure. However such an approach does not allow a perfect real impedance to be presented at the package since an inductive bond wire is provided between the last capacitor and the device output terminal. This approach also provides impedance inversion, and is therefore not transparent to load modulation.

SUMMARY

The embodiments described herein provide a series resonator with inverse characteristics of the parallel resonator typically connected to the output of an RF transistor, so that the response of the parallel resonator over frequency is compensated for by the series resonator. The RF transistor can be tailored to exhibit virtually ideal load contour placement at the center frequency with minimal change over a wide bandwidth due to the compensating nature of the two resonators. This allows an amplifier to be designed with wideband structures such as Klopfenstein tapered lines, and allows use of a wideband Doherty combining network, among other applications. The embodiments described herein also provide enhanced bandwidth for fixed load applications.

According to an embodiment of an amplifier circuit, the circuit includes an RF transistor, a parallel resonator and a series resonator. The RF transistor has an input, an output and an intrinsic output capacitance. The parallel resonator is connected to the output of the RF transistor and includes a first inductive component coupled in parallel with the intrinsic output capacitance of the RF transistor. The series resonator connects the output of the RF transistor to an output terminal and includes a second inductive component connected in series with a capacitive component. The series resonator is operable to compensate for a change in impedance of the parallel resonator over frequency.

According to an embodiment of a method of operating an amplifier circuit, the method includes: amplifying a signal input to an RF transistor also having an output and an intrinsic output capacitance; coupling a first inductive component in parallel with the intrinsic output capacitance of the RF transistor to form a parallel resonator coupled to the output of the RF transistor; coupling the output of the RF transistor to an output terminal via a series resonator which includes a second inductive component connected in series with a capacitive component; and compensating for a change in impedance of the parallel resonator over frequency via the series resonator.

According to another embodiment of an amplifier circuit, the circuit includes an RF transistor, a parallel resonator and a series resonator. The RF transistor has an input, an output and an intrinsic output capacitance. The RF transistor is operable to function at a first load impedance in a load modulation mode and at a second lower load impedance in a full power mode. The parallel resonator is connected to the output of the RF transistor and includes a first inductive component connected in parallel with the intrinsic output capacitance of the RF transistor. The series resonator connects the output of the RF transistor to an output terminal and includes a second inductive component connected in series with a capacitive component. The series resonator in conjunction with the parallel resonator is operable to maintain a real load impedance for the RF transistor in both the load modulation mode and the full power mode for the same frequency.

According to an embodiment of a Doherty amplifier circuit, the circuit includes a first output terminal, a second output terminal, a main amplifier, a peaking amplifier, a parallel resonator and a series resonator. The main amplifier is biased at Class B or AB mode and has an input, an output and an intrinsic output capacitance. The main amplifier is operable to function at a first load impedance in a load modulation mode and at a second lower load impedance in a full power mode. The peaking amplifier is biased at Class C mode and electrically connected to the second output terminal. The parallel resonator is connected to the output of the main amplifier and includes a first inductive component connected in parallel with the intrinsic output capacitance of the main amplifier. The series resonator connects the output of the main amplifier to the first output terminal and includes a second inductive component connected in series with a capacitive component. The series resonator in conjunction with the parallel resonator is operable to maintain a real load impedance for the main amplifier in both the load modulation mode and the full power mode for the same frequency.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
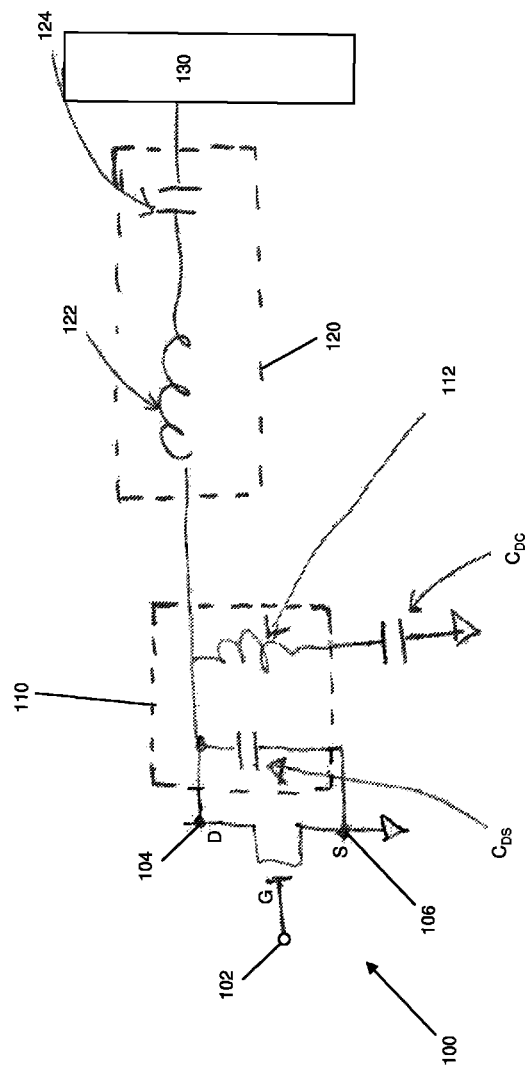
FIG. 1 illustrates a circuit diagram of an amplifier circuit including an RF transistor, a parallel resonator and a series resonator.

FIG. 1 illustrates an embodiment of an amplifier circuit which includes an RF transistor 100, a parallel resonator 110 and a series resonator 120. The RF transistor 100 has an input 102, an output 104 and an intrinsic output capacitance ($C_{DS}$). The RF transistor 100 amplifies a signal provided at the transistor input 102. The RF transistor 100 may operate in fixed load applications where the load impedance on the transistor remains constant. The RF transistor 100 may also operate in load modulated applications where the load impedance on the transistor 100 is higher at low power settings to improve efficiency and is lower at full power. In one embodiment, the RF transistor 100 is an LDMOS (laterally diffused metal oxide semiconductor) transistor where the gate (G) of the LDMOS transistor is the input 102, the drain (D) is the output 104 and the intrinsic output capacitance is referenced between the drain and source (S) 106 of the transistor 100. In another embodiment, the RF transistor 100 is a GaN MESFET (metal semiconductor field effect transistor), GaAs HBT (heterojunction bipolar transistor), PHEMT (pseudomorphic high electron mobility transistor), or other type of transistor. GaN has an inherently lower parasitic output capacitance for a comparable power device compared to silicon technologies. The GaN MESFET like the LDMOS transistor has a gate (G) as the input 102, a drain (D) as the output 104 and the intrinsic output capacitance is referenced between the drain and source. The transistor source 106 may be connected to ground or some other potential. Other types or configurations of transistors may be used instead e.g. such as a heterojunction bipolar transistor or any other type of RF power transistor.

In each case, the parallel resonator 110 is connected to the output 104 (drain in FIG. 1) of the RF transistor 100. The parallel resonator 110 includes an inductive component 112 coupled in parallel with the intrinsic output capacitance $C_{Ds}$ of the RF transistor 100. The transistor 100 shown in FIG. 1 is an LDMOS or GaN MESFET transistor and therefore the inductive component 112 of the parallel resonator 110 is coupled in parallel with the intrinsic output capacitance between the drain and ground. In one embodiment, the inductive component 112 of the parallel resonator 110 is a tuning bond wire and a DC blocking capacitor ($C_{DC}$) is connected in series with the tuning bond wire to prevent an undesirable DC path to ground at the transistor output 104.

Also connected to the output 104 of the RF transistor 100 is the series resonator 120. The series resonator 120 connects the transistor output 104 to an output terminal 130 of the amplifier circuit (e.g. at the edge of a package which includes the amplifier circuit). The series resonator 120 includes an inductive component 122 connected in series with a capacitive component 124. In one embodiment, the inductive component 122 of the series resonator 120 is a bond wire which couples the output 104 of the RF transistor 100 to the capacitive component 124 which can be an RF MOS capacitor. The series resonator 120 compensates for a change in the impedance of the parallel resonator 110 over frequency. While the series resonator 120 does not reduce the Q of the parallel resonator 110, the series resonator 120 does enable a 'real' optimal load impedance for the RF transistor 100 because the parasitic inductance of the drain bond wire is absorbed into the inductive component 122 of the series resonator 120. Accordingly, the RF transistor 100 can essentially have ideal 'real' impedance load contours and a much lower Q is provided at the packaged device level. The series resonator 120 also provides compensation over frequency to the parallel resonator 110 which is present in large RF power devices, enabling a wide bandwidth to be achieved.

Figure 2:
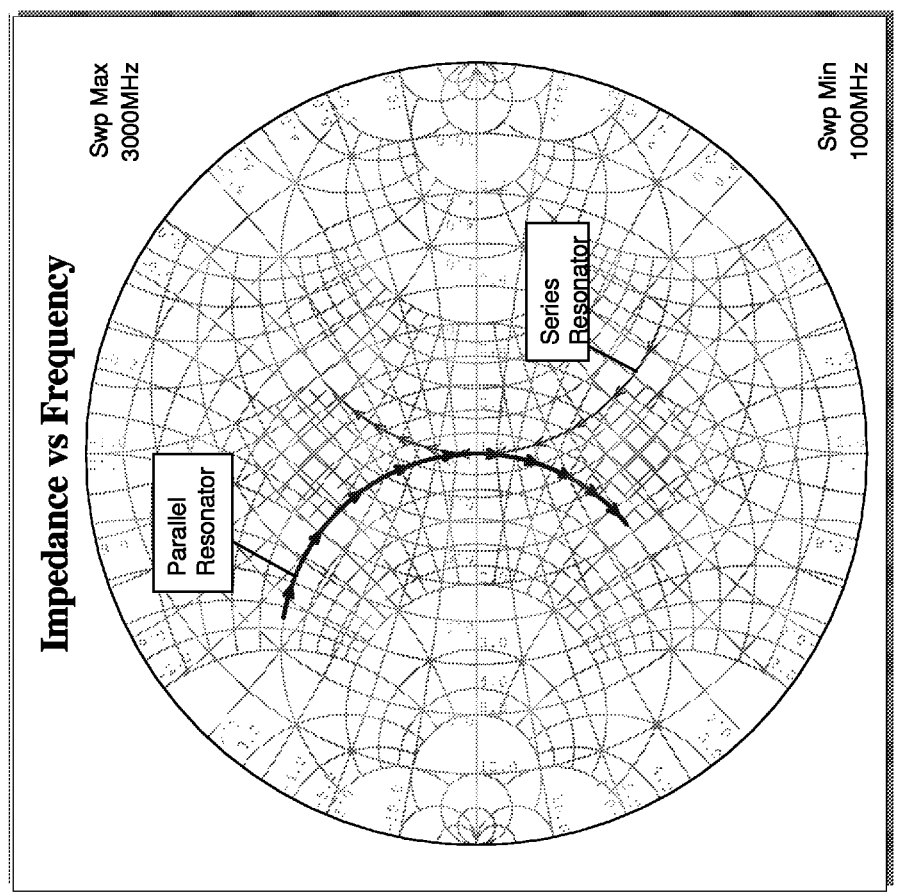
FIG. 2 illustrates a Smith chart of the individual impedances of the parallel resonator and series resonator shown in FIG. 1.

FIG. 2 shows a Smith chart of the individual impedances of the parallel resonator 110 and the series resonator 120 over a frequency sweep of 2000 MHz for a particular set of device parameters. The impedance of the parallel resonator 110 is represented by the curve labelled 'parallel resonator' and the impedance of the series resonator 120 is represented by the curve labelled 'series resonator' in FIG. 2. The parallel resonator 110 becomes less inductive as the frequency increases and eventually becomes capacitive at high enough frequencies as indicated by the generally downward facing arrows included along the curve labelled 'parallel resonator' in FIG. 2 (the downward arrows indicating increasing frequency). To compensate for this response of the parallel resonator 110 which would otherwise adversely affect bandwidth if left unmitigated, the series resonator 120 becomes more inductive as the frequency increases as indicated by the generally upward facing arrows included along the curve labelled 'series resonator' in FIG. 2. The opposite response occurs when the frequency decreases, that is the parallel resonator 110 becomes more inductive and the series resonator 120 becomes less inductive. The series resonator 120 is thus designed to counterbalance, offset or otherwise at least partly counteract the change in inductivity of the parallel resonator 110 over frequency.

Figure 3:
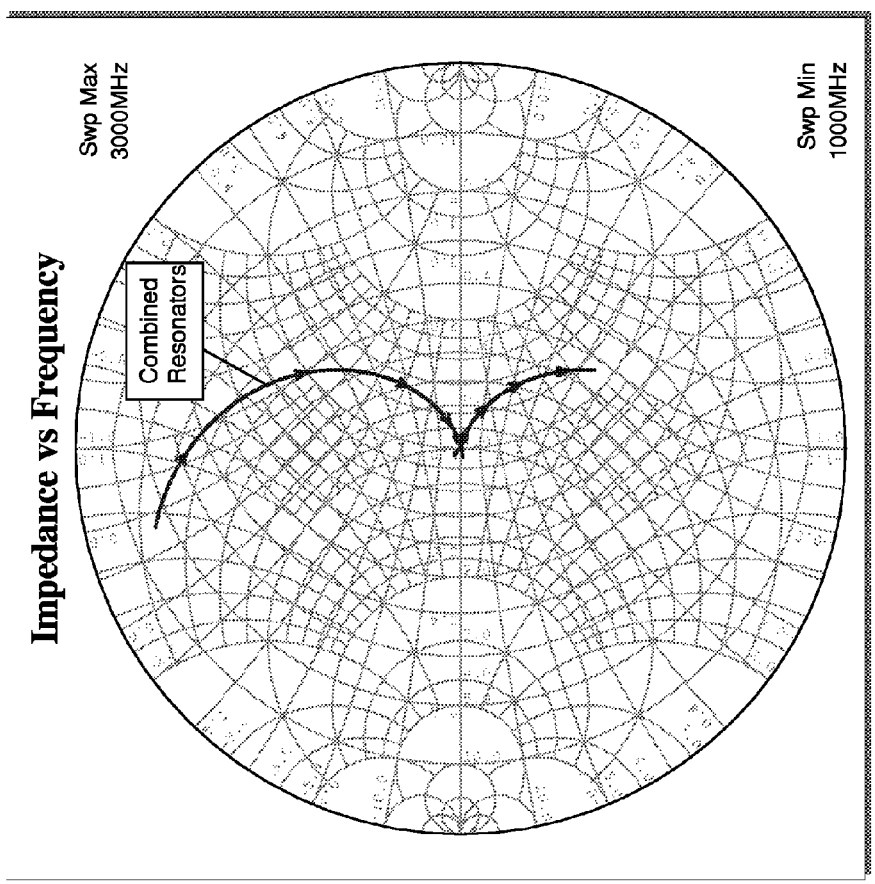
FIG. 3 illustrates a Smith chart of the combined impedance of the parallel resonator and series resonator shown in FIG. 1.

FIG. 3 shows a Smith chart of the combined impedance of both resonators 110, 120 over the frequency sweep as in FIG. 2 and for the same set of device parameters. The compensating influence of the series resonator 120 on the impedance of the parallel resonator 110 over frequency results in a combined load impedance for the RF transistor 100 which folds in toward the real axis over a wider frequency range as compared to the same circuit without the series resonator 120. Such a folded response enhances the bandwidth of the amplifier circuit, making it well suited for wideband applications. Various simulations show the bandwidth of the amplifier circuit is at least 1.5× greater with the series resonator 120 than without the series resonator 120.

Figure 4:
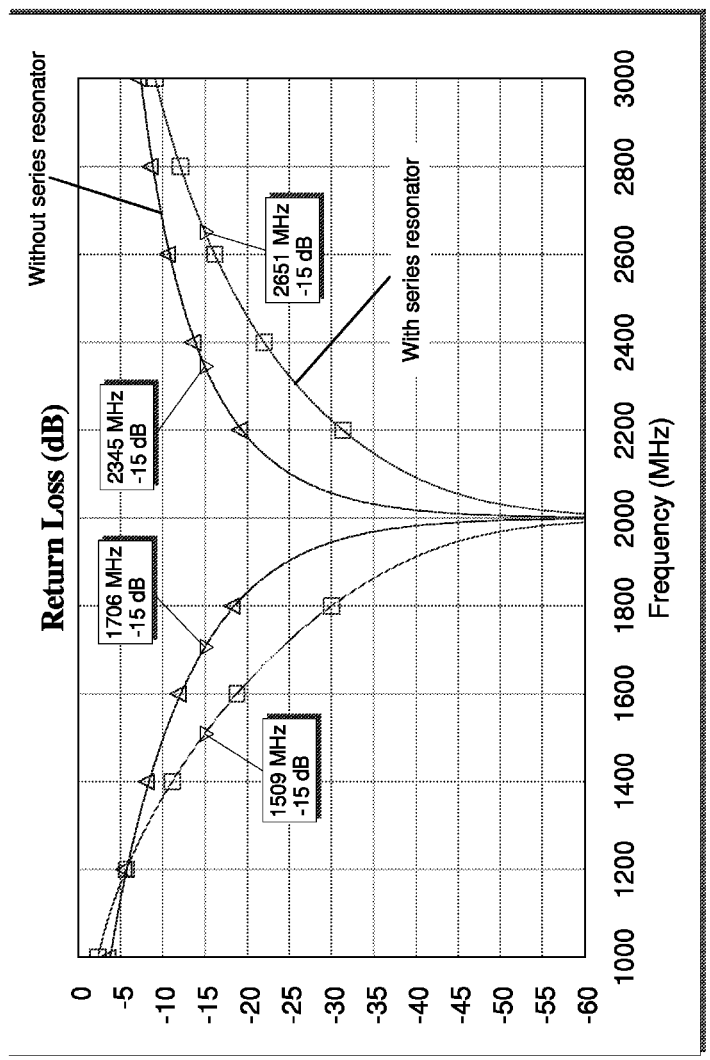
FIG. 4 illustrates a plot diagram of the bandwidth response of the reactive elements of an amplifier circuit which includes an RF transistor, a parallel resonator and a series resonator for a fixed load impedance.

FIG. 4 shows the return loss (in dB) over frequency for an exemplary LDMOS transistor die with a 30 pF intrinsic output capacitance running into a fixed optimum load impedance. In this fixed load impedance example, the exemplary LDMOS transistor provides a bandwidth of about 1142 MHz with the series resonator 120 included in the circuit and a bandwidth of about only 639 MHz without the series resonator 120 (bandwidth being measured at −15 dB return loss point in this example). Including the series resonator 120 in this exemplary circuit yields a 1.8× bandwidth enhancement. The bandwidth enhancement remains about 1.8× (with the series resonator) irrespective of die size and parasitic/die periphery.

Figure 5:
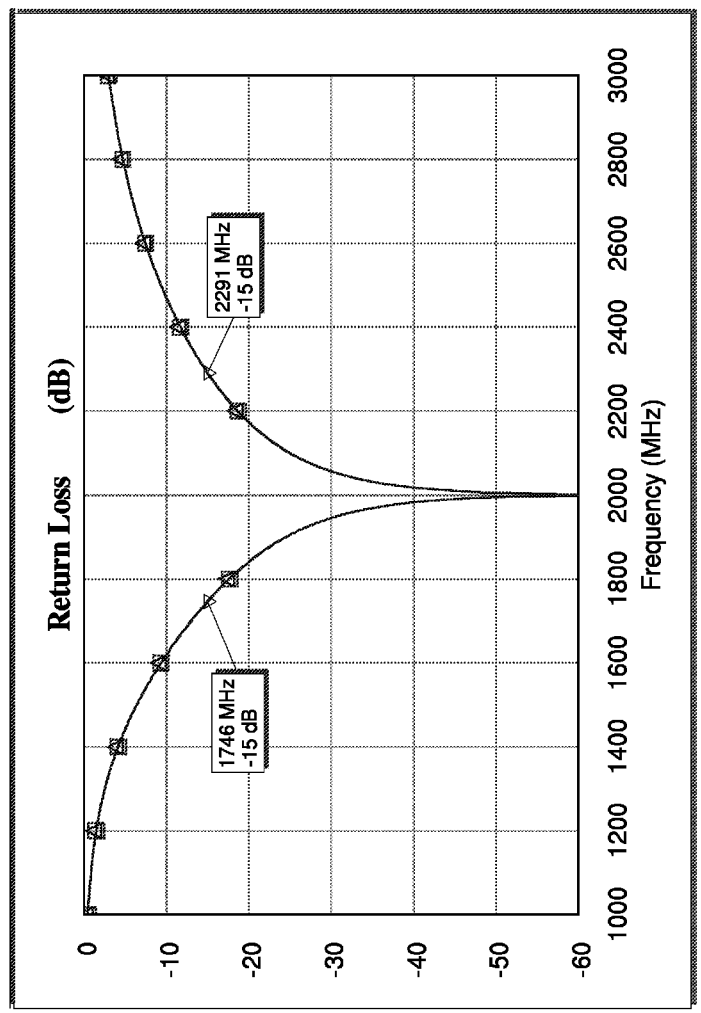
FIG. 5 illustrates a plot diagram of the bandwidth response of the reactive elements of an amplifier circuit which includes an RF transistor, a parallel resonator and a series resonator for a modulated load impedance.

FIG. 5 shows the return loss (in dB) over frequency for the same exemplary 90 mm LDMOS transistor die as described above, but in a load modulated application. The exemplary LDMOS transistor is optimized for 2:1 load modulation in this example (e.g. a 6Ω load modulation mode and 3Ω full power mode). Under such operating conditions, the exemplary LDMOS transistor has a bandwidth of about 545 MHz with the series resonator 120 included in the circuit for both the high impedance load modulation mode and the low impedance full power mode (bandwidth being measured at −15 dB return loss point in this example). Without the series resonator 120, the exemplary LDMOS transistor only has a bandwidth of about 319 MHz in the high impedance load modulation mode, yielding a 1.7× bandwidth enhancement with the series resonator 120. The bandwidth enhancement remains about 1.7× irrespective of die size and parasitic/die area.

In one load modulation embodiment, the amplifier circuit of FIG. 1 may be a Doherty amplifier circuit and the RF transistor 100 is the main amplifier of the Doherty amplifier circuit. The RF transistor 100 functions at a first (higher) load impedance in the load modulation mode and at a second (lower) load impedance in the full power mode. The parallel resonator 110 is connected to the output 104 of the RF transistor 100 and includes an inductive component 112 connected in parallel with the intrinsic output capacitance $C_{DS}$ of the RF transistor 100 as previously described herein. The series resonator 120 connects the output 104 of the RF transistor 100 to the output terminal 130 of the main amplifier also as previously described herein. The series resonator 120 in conjunction with the parallel resonator 110 maintains a real load impedance for the RF transistor 100 (the main amplifier in this embodiment) in both the load modulation and full power modes for the same frequency. The series resonator 120 in conjunction with the parallel resonator 110 can also maintain the same bandwidth for the amplifier circuit in the load modulation and full power modes.

Figure 6:
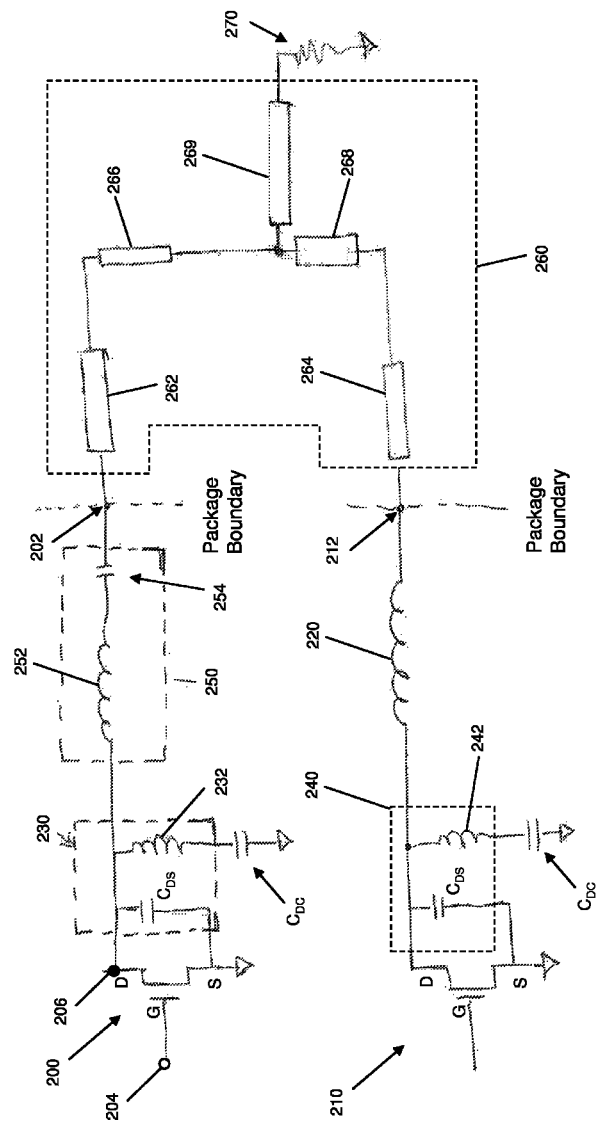
FIG. 6 illustrates a circuit diagram of a Doherty amplifier circuit including a main amplifier with a parallel resonator and a series resonator.

FIG. 6 illustrates an embodiment of a Doherty amplifier circuit for use in load modulated applications. The Doherty amplifier circuit includes a main amplifier 200, an output terminal 202 for the main amplifier 200, a peaking amplifier 210, and an output terminal 212 for the peaking amplifier 210. The main amplifier 200 is biased at Class B or AB mode and has an input 204, an output 206 and an intrinsic output capacitance ($C_{DS}$). The peaking amplifier 210 is biased at Class C mode and electrically connected to the output terminal 212 via e.g. a bond wire 220. Both amplifiers 200, 210 have a parallel resonator 230, 240 connected to the output of the respective amplifiers 200, 210. Each parallel resonator 230, 240 has an inductive component 232, 242 such as a tuning bond wire connected in parallel with the intrinsic output capacitance $C_{DS}$ of the corresponding amplifier 200, 210. A DC blocking capacitor ($C_{DC}$) may be connected in series with each respective tuning bond wire 232, 242.

The Doherty amplifier circuit also includes a series resonator 250 which connects the output 206 of the main amplifier 200 to the output terminal 202 for the main amplifier 200. The series resonator 250 includes an inductive component 252 such as a bond wire connected in series with a capacitive component 254 such as an RF MOS capacitor.

The main amplifier 200 functions at a first (higher) load impedance in a load modulation mode and at a second lower load impedance in a full power mode. At low power levels, only the main amplifier 200 is operational. The efficiency of the main amplifier 200 increases as the power level increases. The main amplifier 200 eventually reaches a maximum efficiency point as the power level continues to rise. At this power level, the peaking amplifier 210 turns on. The efficiency of the peaking amplifier 210 similarly increases for power levels above this point. One or more additional peaking amplifiers can be provided. The series resonator 250 in conjunction with the parallel resonator 230 of the main amplifier 200 maintains a real load impedance for the main amplifier 200 in both the load modulation mode and the full power mode for the same frequency. The series resonator 250 in conjunction with the parallel resonator 230 can also maintain the same bandwidth for the Doherty amplifier circuit in the load modulation mode and the full power mode if desired as previously explained herein.

The amplifier output terminals 202, 212 are at the package boundary, meaning external connections are made to these terminals 202, 212. A Doherty combining network 260 which can be a wideband combiner in some applications, can be connected to the amplifier output terminals 202, 212 for connecting the Doherty amplifier circuit to a load 270. The Doherty combining network 260 combines or sums the load currents of the amplifiers 200, 210 so that the output voltage of the Doherty amplifier circuit is determined by the summation of the load currents multiplied by the load impedance. For example, the Doherty combining network 260 can have an output matching circuit 262 connected to the main amplifier output terminal 202 and another output matching circuit 264 connected to the peaking amplifier output terminal 212. A first power combiner 266 connects the first output matching circuit 262 to an impedance transformer 269 and a second power combiner 268 connects the second output matching circuit 264 to the same node of the impedance transformer 269. The other node of the impedance transformer 269 is connected to the load 270. The impedance combiner 269 may have a tapered shape with a wider end coupled to the power combiners 266, 268 and a narrower end connected to the load 270 or vice-versa. During operation for example, the impedance transformer 269 can transform the load impedance at one terminal to a transformed impedance at the other terminal which matches (i.e. identically or nearly identically) the impedance of the first and second power combiners 266, 268. Alternatively, other types of Doherty combining networks can be used.

Figure 7:
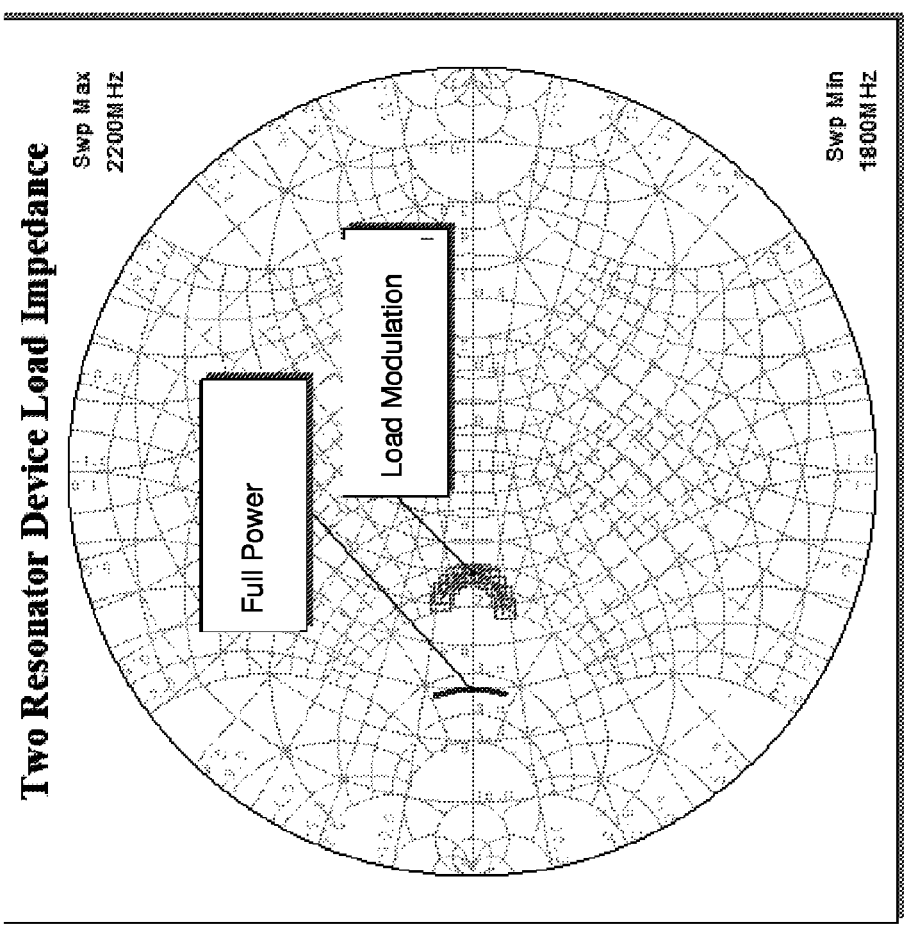
FIG. 7 illustrates a Smith chart of the load impedance of the main amplifier circuit shown in FIG. 6.

FIG. 7 shows a Smith chart of the combined load impedance of the parallel and series resonators 230, 250 coupled to the main amplifier 200 over a frequency sweep of 400 MHz. The combined load impedance for the main amplifier 200 in the load modulated mode is represented by the curve labelled 'load modulation' and the combined load impedance for the main amplifier 200 in the full power mode is represented by the curve labelled 'full power' in FIG. 7. The combined load impedance for the main amplifier 200 falls on the real axis in both the load modulated mode and the full power mode for the same center frequency. In FIG. 7, this frequency is 2000 MHz and the real impedance is 6Ω in the load modulated mode and 3Ω in the full power mode. Without the series resonator 250, the main amplifier load impedance would always fall in the capacitive region of the Smith chart because of the drain bond wire inductance. This bond wire inductance is absorbed by the series resonator 250 when included in the circuit. This enables optimum performance to be obtained using wideband impedance transformers such as a Klopfenstein taper.

Terms such as "first", "second", and the like, are used to describe various elements, regions, sections, etc. and are not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An amplifier circuit, comprising:
an RF transistor having an input, an output and an intrinsic capacitance;
a parallel resonator coupled to the output of the RF transistor and comprising a first inductive component coupled in parallel with the intrinsic capacitance of the RF transistor; and
a series resonator coupling the output of the RF transistor to an output terminal and comprising a second inductive component connected in series with a capacitive component, the series resonator having inverse impedance characteristics of the parallel resonator with respect to a single center frequency of the RF transistor so that the series resonator is operable to counteract a change in impedance of the parallel resonator over a wideband frequency range of the RF transistor.

2. An amplifier circuit according to claim 1, wherein the first inductive component is a tuning bond wire coupling the output of the RF transistor to a DC blocking capacitor and the second inductive component is a bond wire coupling the output of the RF transistor to an RF MOS capacitor which forms the capacitive component of the series resonator.

3. An amplifier circuit according to claim 1, wherein the RF transistor is an LDMOS transistor.

4. An amplifier circuit according to claim 1, wherein the RF transistor is a GaN MESFET.

5. An amplifier circuit according to claim 1, wherein the parallel resonator is operable to become less inductive and the series resonator is operable to become more inductive as the frequency decreases, and the parallel resonator is operable to become more inductive and the series resonator is operable to become less inductive as the frequency increases.

6. An amplifier circuit according to claim 1, wherein a bandwidth of the amplifier circuit is at least 1.5× greater with the series resonator than without the series resonator.

7. An amplifier circuit according to claim 6, wherein the bandwidth of the amplifier circuit is at least 1.7× greater with the series resonator than without the series resonator.

8. An amplifier circuit according to claim 1, wherein the amplifier circuit is a Doherty amplifier circuit and the RF transistor is a main amplifier of the Doherty amplifier circuit.

9. A method of operating an amplifier circuit, comprising:
amplifying a signal input to an RF transistor also having an output and an intrinsic capacitance;
coupling a first inductive component in parallel with the intrinsic capacitance of the RF transistor to form a parallel resonator coupled to the output of the RF transistor;
coupling the output of the RF transistor to an output terminal via a series resonator which includes a second inductive component connected in series with a capacitive component, the series resonator having inverse impedance characteristics of the parallel resonator with respect to a single center frequency of the RF transistor; and
counteracting a change in impedance of the parallel resonator over a wideband frequency range of the RF transistor via the series resonator.

10. A method according to claim 9, wherein a change in impedance of the parallel resonator over frequency is counteracted via the series resonator by:
decreasing the inductivity of the parallel resonator and increasing the inductivity of the series resonator as the frequency decreases; and
increasing the inductivity of the parallel resonator and decreasing the inductivity of the series resonator as the frequency increases.

11. An amplifier circuit, comprising:
an RF transistor having an input, an output and an intrinsic capacitance, the RF transistor being operable to function at a first load impedance in a load modulation mode and at a second lower load impedance in a full power mode;
a parallel resonator coupled to the output of the RF transistor and comprising a first inductive component coupled in parallel with the intrinsic capacitance of the RF transistor; and
a series resonator coupling the output of the RF transistor to an output terminal and comprising a second inductive component connected in series with a capacitive component, the series resonator having inverse impedance characteristics of the parallel resonator with respect to a single center frequency of the RF transistor so that the series resonator in conjunction with the parallel resonator are operable to maintain a real load impedance for the RF transistor in both the load modulation mode and the full power mode for the same frequency.

12. An amplifier circuit according to claim 11, wherein the series resonator in conjunction with the parallel resonator are operable to maintain the same bandwidth for the amplifier circuit in the load modulation mode and the full power mode.

13. An amplifier circuit according to claim 11, wherein the first inductive component is a tuning bond wire coupling the output of the RF transistor to a DC blocking capacitor and the second inductive component is a bond wire coupling the output of the RF transistor to an RF MOS capacitor which forms the capacitive component of the series resonator.

14. An amplifier circuit according to claim 11, wherein the RF transistor is an LDMOS transistor.

15. An amplifier circuit according to claim 11, wherein the RF transistor is a GaN MESFET.

16. An amplifier circuit according to claim 11, wherein the parallel resonator is operable to become less inductive and the series resonator is operable to become more inductive as the frequency decreases, and the parallel resonator is operable to become more inductive and the series resonator is operable to become less inductive as the frequency increases.

17. An amplifier circuit according to claim 11, wherein a bandwidth of the amplifier circuit is at least 1.5× greater with the series resonator than without the series resonator.

* * * * *